United States Patent
Schuurmans

(10) Patent No.: US 7,060,216 B2
(45) Date of Patent: Jun. 13, 2006

(54) TIRE PRESSURE SENSORS AND METHODS OF MAKING THE SAME

(75) Inventor: Johan Schuurmans, Balen (BE)

(73) Assignee: Melexis, NV, Ieper (BE)

( * ) Notice: Subject to any disclaimer, the term of this patent is extended or adjusted under 35 U.S.C. 154(b) by 720 days.

(21) Appl. No.: 09/956,483

(22) Filed: Sep. 18, 2001

(65) Prior Publication Data

US 2002/0168795 A1 Nov. 14, 2002

Related U.S. Application Data

(60) Provisional application No. 60/290,326, filed on May 11, 2001.

(51) Int. Cl.
B29C 45/14 (2006.01)
B29C 70/70 (2006.01)

(52) U.S. Cl. .................. 264/272.15; 264/272.17; 264/278; 438/112; 438/106

(58) Field of Classification Search .......... 264/272.15, 264/272.17, 272.12, 275, 278; 438/106, 438/112
See application file for complete search history.

(56) References Cited

U.S. PATENT DOCUMENTS

| 3,706,840 | A | * | 12/1972 | Moyle et al. ............... 174/52.2 |
| 4,823,605 | A | * | 4/1989 | Stein ........................... 73/727 |
| 5,562,787 | A | * | 10/1996 | Koch et al. .................... 156/64 |
| 5,622,873 | A | | 4/1997 | Kim et al. |
| 5,731,754 | A | * | 3/1998 | Lee et al. ..................... 340/447 |
| 5,960,844 | A | * | 10/1999 | Hamaya .................... 152/152.1 |
| 5,977,870 | A | * | 11/1999 | Rensel et al. ................. 340/447 |
| 6,208,244 | B1 | * | 3/2001 | Wilson et al. ............... 340/447 |
| 6,254,815 | B1 | * | 7/2001 | Cheperak ..................... 264/135 |
| 6,388,567 | B1 | * | 5/2002 | Bohm et al. ................. 340/442 |
| 6,444,069 | B1 | * | 9/2002 | Koch et al. .................. 156/123 |
| 6,534,711 | B1 | * | 3/2003 | Pollack ....................... 174/52.2 |
| 6,543,277 | B1 | * | 4/2003 | Koch et al. .................... 73/120 |
| 6,580,363 | B1 | * | 6/2003 | Wilson ....................... 340/445 |
| 6,688,353 | B1 | * | 2/2004 | Koch ....................... 152/152.1 |
| 6,722,191 | B1 | * | 4/2004 | Koch et al. .................... 73/146 |

FOREIGN PATENT DOCUMENTS

| EP | 0 813 236 A1 | 12/1997 |
| JP | 04 352435 A | 12/1992 |
| JP | 06 196750 A | 7/1994 |
| JP | 08 005473 A | 1/1996 |
| JP | 09 119875 A | 5/1997 |
| JP | 09 298249 A | 11/1997 |
| JP | 09 304211 A | 11/1997 |
| JP | 11 307808 A | 11/1999 |

* cited by examiner

*Primary Examiner*—Angela Ortiz
(74) *Attorney, Agent, or Firm*—Gerald T. Gray; Townsend and Townsend and Crew LLP

(57) ABSTRACT

The elements of a tire pressure monitoring and transmitting system are encapsulated into a single package. A pressure sensitive device is covered with a flexible gel coat and then inserted into a molding tool cavity. A removable pin is incorporated into the molding tool and in its normal position is in contact with the gel. A molding compound is injected into the cavity so as to encapsulate the device and gel coat. When the pin is extracted and the device ejected from the molding cavity, an airway is left defined by the removable pin. The airway exposes the flexible gel covering the pressure sensitive device to the local air pressure, whereby the gel, being flexible, transfers the pressure to the pressure sensitive device.

19 Claims, 1 Drawing Sheet

General Schematic

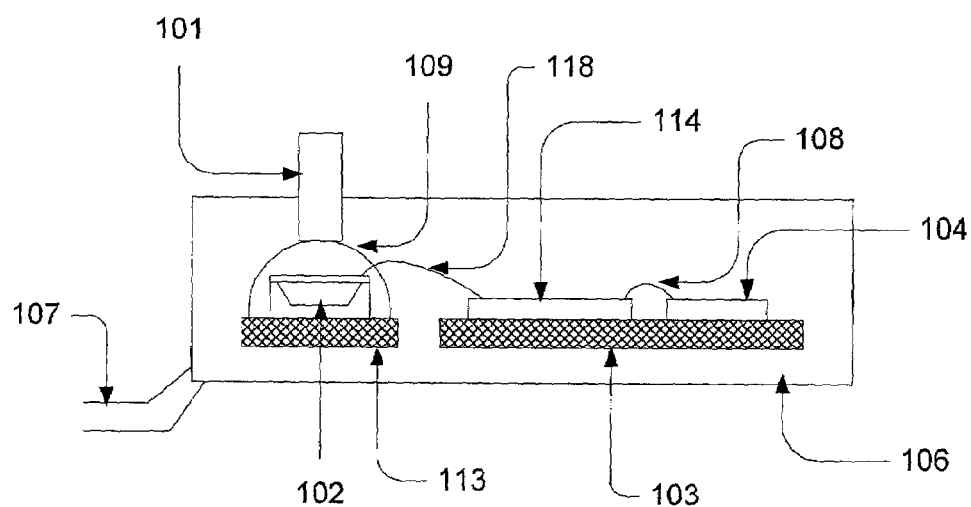
Figure 1. General Schematic
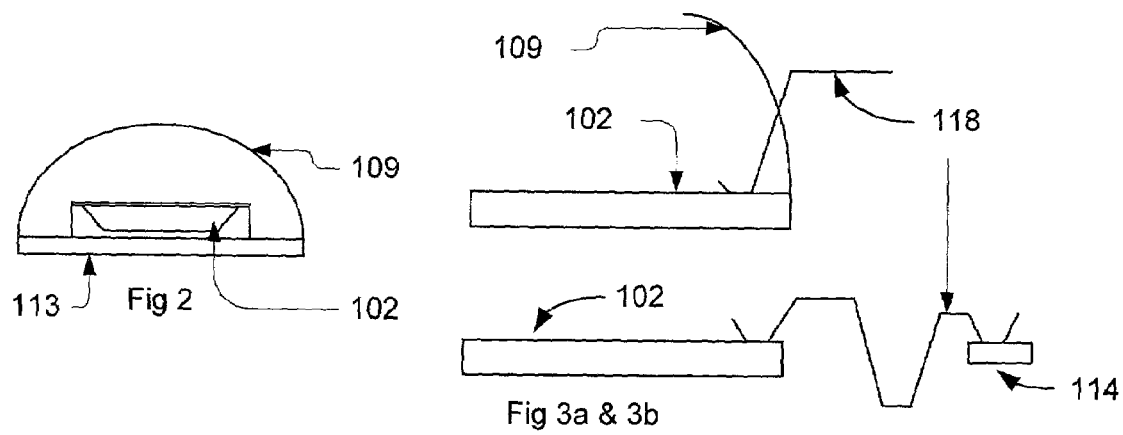

TIRE PRESSURE SENSORS AND METHODS OF MAKING THE SAME

CROSS REFERENCES TO RELATED APPLICATIONS

This application claims the benefit of U.S. Provisional Application Ser. No. 60/290,326, filed May 11, 2001, entitled "Tire Pressure Sensors and Methods of Making the Same," which is hereby incorporated by reference in its entirety for all purposes. This application is also related to U.S. patent application Ser. No. 09/956,469, now U.S. Pat. No. 6,762,077, entitled "Integrated Sensor Packages and Methods of Making the Same," filed concurrently with this application on Sep. 18, 2001.

BACKGROUND OF THE INVENTION

The present invention relates in general to pressure monitoring systems, and more particularly to systems and methods for encapsulating a pressure sensing element. The present invention is particularly useful for producing low cost tire pressure monitoring systems for the automotive industry.

Automatically sensing automotive tire pressures while the vehicle is moving has become a necessary feature of modem vehicle design. The planned use of tires designed to run flat so as to allow a driver to continue their journey at least to a place of safety is such an example necessitating such capability. Such tires however cannot be run indefinitely or at sustained high speeds so it is imperative that the driver is informed on loss of pressure. In conventional tires, loss of pressure can also lead to increased fuel consumption, reduced vehicle stability and the dangers of tire blow out and a subsequent accident.

There are many ways of transmitting the information relating to tire pressure from the tire to the vehicle for subsequent processing and display to the driver. One common way is to include an electronic module mounted on the wheel containing a pressure sensor, interface means and transmitting means such that a signal is sent from the tire pressure sensing module to an on-vehicle receiving and processing module. The pressure-sensing module has been variously proposed to be mounted on the wheel, inside the tire, embedded in the valve or as an external attachment to the valve. Different arrangements have been proposed for original equipment as opposed to aftermarket equipment. Most systems use a pressure sensor as the means of determining the pressure of the air within the tire.

It is desirable to provide low cost pressure sensors, and in particular tire pressure sensors, and efficient methods of producing the same.

SUMMARY OF THE INVENTION

The present invention provides pressure sensors and integrated circuits for use in detecting the pressure of air in a tire, and methods for producing the same. The techniques of the present invention include assembly methodologies that provide low cost sensor devices while maintaining the inherent high reliability as typically found in modern semiconductor packaging techniques.

According to the present invention, the elements of a wheel mounted tire pressure monitoring and transmitting system are encapsulated into a single package. A pressure sensitive device is covered with a flexible gel coat and then inserted into a molding tool cavity. A removable pin is incorporated into the molding tool and in its normal position is in contact with the gel. A molding compound is injected into the cavity so as to encapsulate the device and gel coat. When the pin is extracted and the device ejected from the molding cavity, a passageway in the molding is left defined by the removable pin. The passageway exposes the flexible gel covering the pressure sensitive device to the local air pressure, whereby the gel, being flexible, transfers the pressure to the pressure sensitive device.

According to an aspect of the present invention, a method is provided for encapsulating a pressure sensitive integrated circuit within a plastic molded package. The method typically includes providing an integrated circuit having a pressure sensing element and one or more electrical connectors, applying a quantity of gel to the integrated circuit such as to cover at least the pressure sensing element, thereby forming a gel-covered assembly, and inserting the gel-covered assembly into a cavity of a molding tool. The method also typically includes attaching a retractable pin to the gel-covered assembly, introducing a plastic mold compound into the cavity so as to encapsulate the gel-covered assembly and at least a portion of the pin, and removing the pin from the gel such as to leave a passageway or hole in the plastic mold encapsulating the gel-covered assembly, thereby exposing the gel to the pressure of the atmosphere through the hole, whereby the gel transfers the pressure to the pressure sensitive integrated circuit.

According to another aspect of the present invention, an encapsulated pressure sensitive integrated circuit assembly is provided. The encapsulated assembly is typically formed, in part, by providing an integrated circuit having a pressure sensing element and one or more electrical connectors, applying a quantity of gel to the integrated circuit such as to cover at least the pressure sensing element, thereby forming a gel-covered assembly, and inserting the gel-covered assembly into a cavity of a molding tool. The encapsulated assembly is further typically formed by attaching a retractable pin to the gel-covered assembly, introducing a plastic mold compound into the cavity so as to encapsulate the gel-covered assembly and at least a portion of the pin, and removing the pin from the gel such as to leave a passageway or hole in the plastic mold encapsulating the gel-covered assembly, thereby exposing the gel to the pressure of the atmosphere through the hole, whereby the gel transfers the pressure to the pressure sensitive integrated circuit.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 1 is a schematic diagram showing a general arrangement illustrating a process of encapsulating a pressure sensing circuit assembly according to the present invention;

FIG. 2 illustrates a gel-covered pressure sensing circuit assembly according to the present invention; and FIGS. 3a and 3b illustrate alternate embodiments of electrical connector arrangements according to the present invention.

DESCRIPTION OF THE SPECIFIC EMBODIMENTS

In a conventional method of packaging semiconductor devices, an integrated circuit is typically first mounted on a metal carrier or 'paddle'. The electrical connections to the integrated circuit are then made by wire bonding between the connection points on the integrated circuit and the internal ends of the metal pins that will form the connections to the final package.

The integrated circuit assembly is then potted or encapsulated in plastic using injection-molding techniques. Such a package can contain one or more integrated circuits mounted on the 'paddle' which itself may include one or more electrically separate sections for circuitry reasons. In the present invention, such standard packaging techniques are modified to permit the encapsulation, within a standard package, of integrated circuits that are designed to be sensitive to pressure and therefore can be used as part of pressure sensors.

To achieve this, a packaging process in accordance with the invention is provided as shown in FIG. 1. A pressure sensitive integrated circuit element 102 is mounted on a 'paddle' 113 and electrical connections 118 with other circuitry 114 on 'paddle' 103 are made in the conventional manner. Although any number of other pressure sensing elements may be implemented, examples of such sensing elements include MLX90210 and MLX90240 pressure sensor IC's available from Melexis at their website (www dot melexis dot com) or in the US at 41 Locke Road, Concord, N.H. 03301. It should be appreciated that the paddle could be a single integral construction with different sections, e.g., sections 103 and 113, or each section could be a separate construction, e.g., separate paddle elements 103 and 113. The pressure sensitive integrated circuit element 102 is then covered with a blob of gel 109, such as Hipec-9224 from Dow Corning, such as to cover the pressure sensitive integrated circuit. The gel-covered assembly is then placed into a cavity 106 of a plastic-molding tool. Alternatively, the gel is applied after the paddle(s) have been placed in the plastic molding tool. A moveable pin 101 extends from the plastic-molding tool and touches the surface of the gel blob 109. Preferably, pin 101 is an integral part of the molding tool, e.g., extending from an inner surface of a portion of the tool, although a separate pin may be used. In one embodiment, the pin is retractable and is arranged to be long enough to make contact with the gel blob when the pin is extended, and to retract into the bulk of the mold tool when retracted. A plastic encapsulant is then injected (hot and under pressure) via an injection hole 107 in the tool in the conventional manner and fills the cavity 106. The moveable pin 101 is then withdrawn sufficiently to clear the cavity and the molded device is ejected from the tool cavity and is ready for test. In one embodiment, the pin is removed by removing or separating the molding tool portion including the pin. The resulting finished packaged device includes a small hole or passageway through the plastic encapsulant that permits the gel 109 covering the pressure sensitive integrated circuit element 102 to be exposed to the pressure of the atmosphere surrounding the package. This pressure is transferred to the pressure sensitive integrated circuit due to the flexibility of the gel.

In one embodiment of the invention as shown in FIG. 1, one or more additional integrated circuits e.g., circuit elements 104 and 114, are mounted in the same package, which in combination with the pressure sensitive integrated circuit 102 form a pressure sensing assembly that is more suitable for particular applications. The additional integrated circuits may include, for example, signal processing circuitry, power generation circuitry, power supply circuitry, and signal transmission and reception circuitry.

In one embodiment of the invention, additional integrated circuits, e.g., circuitry 114 and 104, are arranged and configured to extract energy from an externally applied radio frequency (RF) field, supply operating power at suitable voltages to each of the integrated circuits in the package, transmit information relating to the pressure sensed by the pressure sensitive integrated circuit 102 such that the encapsulated assembly requires external connections only to a suitable interface, such as an antenna. Such an assembly is ideally suited for such applications as in tire pressure monitoring systems, wherein the assembly is mounted within a tire or the valve of a tire such that the pressure within the tire is sensed and transmitted to the vehicle for use in, for example, an on-board electronic control module to warn the driver of tire pressure loss.

In one embodiment of the invention as shown in FIG. 2, the pressure sensitive integrated circuit element 102 is mounted on a separated section 113 of the die paddle. The dimensions of the separated section 113 are arranged relative to the dimensions of the pressure sensitive integrated circuit element 102 and the surface tension of the gel 109 so that the gel blob covers the whole section of the die paddle 113 and such that the outer gel blob surface stays clear of the die edges. This ensures that there is no opportunity for the plastic encapsulant to touch the pressure sensitive integrated circuit element 102 and induce errors, e.g., errors due to stress.

In a further embodiment as illustrated in FIG. 3a, bond wires 118 between the pressure sensitive integrated circuit element 102 and the interface circuit, e.g., circuitry 114, are arranged to rise from the surface of the pressure sensitive integrated circuit element 102 until they are clear of the gel blob 109. This ensures that the gel has no tendency to creep along the wire and contaminate the surface of the interface circuit. In an alternative embodiment as shown in FIG. 3b (gel 109 not shown), the bond wires 118 are given a more complex variation in height profile such that creep is halted by a section of rising bond wire at some point along its length. In yet another alternative embodiment, the section of paddle 113 carrying the pressure sensitive integrated circuit element is lowered relative to the remainder of the die paddle 103 such that the bond wires naturally rise from the pressure sensitive integrated circuit 102 towards the interface circuit, e.g., circuit 114 of FIG. 1.

It should be appreciated that the invention is a modification to conventional and well understood semiconductor molding techniques and as such problems such as those of the molding compound adhering to the removable pin and precluding its withdrawal are already addressed and solved by using similar techniques as are used to stop the plastic adhering to the mold tool itself. Thermal expansion mismatch between the silicon (or other typical die materials), the metal and the plastic are again already solved within the semiconductor industry. Thermal expansion mismatch between the gel and the other materials are not a problem since the gel is by its nature flexible. The gel will typically expand with the temperature increase resulting from the molding process and then contract as the temperature falls. The gel typically has a much higher, e.g., on the order of approximately eight to ten times higher, temperature coefficient of expansion than the mold compound. Upon cooling after the molding process, the gel typically shrinks so as to leave a gap between the gel and the mold compound that helps reduce or remove mechanical stress on the pressure sensitive integrated circuit that might otherwise reduce the accuracy of the measurements.

In a further embodiment, the pin is arranged as a fixed part of the mold tool and the mold tool separation process is arranged such that the direction of separation extracts the pin from the molded assembly without damage to the pin or the assembly.

In a further embodiment of the invention, the removable pin 109 includes a hollow tube. During the over molding process there may be a tendency in some mold tool designs for the mold compound to move the top of the flexible gel blob 109 such that it is no longer in contact with the pin. To overcome this the pin is replaced by a tube. During the molding process a small amount of suction, e.g., using a vacuum pump, is applied to the external end of the tube such as to hold the gel to the end of the tube and prevent the tube and the gel from becoming separated.

It should be appreciated that the chemical and physical properties of the gel are important for the intended application. For example, the moisture resisting properties and the chemical resistance of the selected gel protect the pressure sensitive integrated circuit from the environment. The mechanical properties, particularly the compressibility of the gel, will affect the time lag in transferring the external pressure to the pressure sensitive integrated circuit. Such a time lag may be desired, since it can be arranged such that impulsive pressures are damped by a combination of the dimensions of the hole and the viscosity of the gel. The damping of the gel may also act as a low pass filter and assist any interface or processing circuitry in extracting the actual mean tire pressure from the noisy signal generated as the tire moves over the road surface. In certain applications, a more suitable flexible compound or even a flexible adhesive compound may replace the gel. Such choices will depend on the physical and chemical attributes of the local environment in which the device is to operate.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of encapsulating a pressure sensitive integrated circuit within a plastic molded package, comprising:
   providing an integrated circuit, the integrated circuit including a pressure sensing element;
   applying a quantity of gel to the integrated circuit such as to cover at least the pressure sensing element, thereby forming a gel-covered assembly;
   inserting the gel-covered assembly into a cavity of a molding tool;
   attaching a retractable pin to the gel-covered assembly;
   introducing a plastic mold compound into the cavity so as to encapsulate the gel-covered assembly and at least a portion of the pin; and
   removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
   wherein the pin is a hollow tube, and wherein the method further comprises applying a reduced air pressure to an external end of the tube to maintain contact between the gel-covered assembly and the tube during the encapsulation.

2. The method of claim 1, wherein the pin is a fixed part of the mold tool and wherein removing includes ejecting the encapsulated assembly from the mold tool such that the pin extracts from the encapsulated assembly.

3. The method of claim 1, wherein the integrated circuit is provided on a metal carrier.

4. The method of claim 3, wherein the gel covers the entire exposed portion of the integrated circuit on the carrier.

5. The method of claim 1, wherein the integrated circuit further includes one or more electrical connectors, and wherein the gel covers a portion of a first one of the one or more electrical connectors.

6. The method of claim 5, wherein the first electrical connector extends upwards from a surface of the integrated circuit so as to prevent the gel from creeping along the connector when the gel is applied to the integrated circuit.

7. The method of claim 5, wherein the first electrical connector includes a variation in height along its length.

8. The method of claim 1, wherein the mold tool includes two or more portions, wherein the pin is a fixed part of a first one of the mold tool portions, wherein attaching includes closing the two or more portions of the molding tool, and wherein removing includes separating the first mold tool portion.

9. A method of encapsulating a pressure sensitive integrated circuit within a plastic molded package, comprising:
   providing an integrated circuit on a carrier, the integrated circuit including a pressure sensing element;
   positioning the carrier into a cavity of a molding tool;
   applying a quantity of gel to the integrated circuit such as to cover at least the pressure sensing element, thereby forming a gel-covered assembly;
   attaching a retractable pin to the gel-covered assembly;
   introducing a plastic mold compound into the cavity so as to encapsulate the gel-covered assembly and at least a portion of the pin; and
   removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
   wherein the pin is a hollow tube, and wherein the method further comprises applying a reduced air pressure to an external end of the tube to maintain contact between the gel-covered assembly and the tube during encapsulation.

10. The method of claim 9, wherein the pin is a fixed part of the mold tool and wherein removing includes ejecting the encapsulated assembly from the mold tool such that the pin extracts from the encapsulated assembly.

11. The method of claim 9, wherein the mold tool includes two or more portions, wherein the pin is a fixed part of a first one of the mold tool portions, wherein attaching includes closing the two or more portions of the molding tool, and wherein removing includes separating the first mold tool portion.

12. The method of claim 9, wherein the gel covers the entire exposed portion of the integrated circuit on the carrier.

13. The method of claim 9, wherein the integrated circuit further includes one or more electrical connectors, and wherein the gel covers a portion of a first one of the one or more electrical connectors.

14. The method of claim 13, wherein the first electrical connector extends upwards from a surface of the integrated circuit so as to prevent the gel from creeping along the connector when the gel is applied to the integrated circuit.

15. The method of claim 13, wherein the first electrical connector includes a variation in height along its length.

16. A method of encapsulating a pressure sensitive integrated circuit within a plastic molded package, comprising:
 providing an integrated circuit, the integrated circuit including a pressure sensing element;
 applying a quantity of gel to the integrated circuit such as to cover at least the pressure sensing element, thereby forming a gel-covered assembly;
 inserting the gel-covered assembly into a cavity of a molding tool;
 attaching a retractable pin to the gel-covered assembly;
 introducing a plastic mold compound into the cavity so as to encapsulate the gel-covered assembly and at least a portion of the pin; and
 removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
 wherein the integrated circuit further includes one or more electrical connectors, wherein the gel covers a portion of a first one of the one or more electrical connectors, and
wherein the first electrical connector extends upwards from a surface of the integrated circuit so as to prevent the gel from creeping along the connector when the gel is applied to the integrated circuit.

17. A method of encapsulating a pressure sensitive integrated circuit within a plastic molded package, comprising:
 providing an integrated circuit, the integrated circuit including a pressure sensing element;
 applying a quantity of gel to the integrated circuit such as to cover at least the pressure sensing element, thereby forming a gel-covered assembly;
 inserting the gel-covered assembly into a cavity of a molding tool;
 attaching a retractable pin to the gel-covered assembly;
 introducing a plastic mold compound into the cavity so as to encapsulate the gel-covered assembly and at least a portion of the pin; and
 removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
 wherein the integrated circuit further includes one or more electrical connectors, wherein the gel covers a portion of a first one of the one or more electrical connectors, and wherein the first electrical connector includes a variation in height along its length.

18. A method of encapsulating a pressure sensitive integrated circuit within a plastic molded package, comprising:
 providing an integrated circuit on a carrier, the integrated circuit including a pressure sensing element;
 positioning the carrier into a cavity of a molding tool;
 applying a quantity of gel to the integrated circuit such as to cover at least the pressure sensing element, thereby forming a gel-covered assembly;
 attaching a retractable pin to the gel-covered assembly;
 introducing a plastic mold compound into the cavity so as to encapsulate the gel-covered assembly and at least a portion of the pin; and
 removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
 wherein the integrated circuit further includes one or more electrical connectors, wherein the gel covers a portion of a first one of the one or more electrical connectors, and wherein the first electrical connector extends upwards from a surface of the integrated circuit so as to prevent the gel from creeping along the connector when the gel is applied to the integrated circuit.

19. A method of encapsulating a pressure sensitive integrated circuit within a plastic molded package, comprising:
 providing an integrated circuit on a carrier, the integrated circuit including a pressure sensing element;
 positioning the carrier into a cavity of a molding tool;
 applying a quantity of gel to the integrated circuit such as to cover at least the pressure sensing element, thereby forming a gel-covered assembly;
 attaching a retractable pin to the gel-covered assembly;
 introducing a plastic mold compound into the cavity so as to encapsulate the gel-covered assembly and at least a portion of the pin; and
 removing the pin from the gel such as to leave a passageway in the plastic mold encapsulating the gel-covered assembly, thereby exposing the gel to the pressure of the atmosphere through the passageway, whereby the gel transfers the pressure to the pressure sensitive integrated circuit,
 wherein the integrated circuit further includes one or more electrical connectors, wherein the gel covers a portion of a first one of the one or more electrical connectors, and wherein the first electrical connector includes a variation in height along its length.

* * * * *